United States Patent [19]

Otaki et al.

[11] Patent Number: 5,254,172
[45] Date of Patent: Oct. 19, 1993

[54] ROTATING FURNACE TUBE HAVING A NON-ROTATING SLIDABLE WORK HOLDER FOR PROCESSING SEMICONDUCTOR SUBSTRATES

[75] Inventors: Toshio Otaki, Takasaki; Hitoshi Ikeda, Annaka; Masato Yamada, Annaka; Takao Takenaka, Annaka, all of Japan

[73] Assignee: Shin-Etsu Handotai Co., Ltd., Tokyo, Japan

[21] Appl. No.: 854,037

[22] Filed: Mar. 19, 1992

[30] Foreign Application Priority Data

Mar. 28, 1991 [JP] Japan ............... 3-089842

[51] Int. Cl.$^5$ ............... B08B 3/04; B05D 7/24
[52] U.S. Cl. ............... 118/725; 118/730; 118/421; 118/416; 432/117
[58] Field of Search ............... 118/725, 730, 421, 416; 432/117; 29/25.01

[56] References Cited

U.S. PATENT DOCUMENTS

| | | | |
|---|---|---|---|
| 3,836,324 | 9/1974 | Shaefer et al. | 432/117 |
| 3,858,553 | 1/1975 | Scheel | 118/421 |
| 4,063,529 | 12/1977 | Bochkarev et al. | 118/730 |
| 4,077,416 | 3/1978 | Johnson, Jr. et al. | |
| 4,629,500 | 12/1986 | Janz et al. | 252/62.56 |
| 4,941,822 | 7/1990 | Evans et al. | 432/117 |
| 5,073,412 | 12/1991 | Gaier | 118/416 |

FOREIGN PATENT DOCUMENTS

505648 5/1971 Switzerland.

Primary Examiner—Olik Chaudhuri
Assistant Examiner—David E. Graybill
Attorney, Agent, or Firm—Nikaido, Marmelstein, Murray & Oram

[57] ABSTRACT

An semiconductor substrate processing apparatus of the type including a furnace tube associated with a fluid supply unit and a fluid discharge unit, wherein the furnace tube is rotatably supported by pairs of confronting rollers and rotated by a motor under the control of a controller in order to achieve various kinds of processing of semiconductor substrates within the furnace tube. With this rotatable furnace tube, the apparatus exhibits high radial temperature uniformity and is able to prevent deformation of the furnace tube.

8 Claims, 6 Drawing Sheets

ROTATING FURNACE TUBE HAVING A NON-ROTATING SLIDABLE WORK HOLDER FOR PROCESSING SEMICONDUCTOR SUBSTRATES

BACKGROUND OF THE INVENTION

1. Field of the Invention

The present invention relates to an apparatus for processing semiconductor substrates in a furnace tube or a reaction tube in order to perform various kinds of processing of the semiconductor substrates, such as heat treatment, chemical vapor deposition (CVD), and liquid-phase epitaxy.

2. Description of the Prior Art

It is well known that when various treatments such as heat treatment, CVD and liquid-phase epitaxy are effected on semiconductor substrates, a tube made of a refractory material such as quartz is used. The tube is generally called as a furnace tube or a reaction tube. For brevity and simplicity, these tubes are hereinafter referred to as "furnace tube". The furnace tube in which a gas flows is unsafe if it is rotated. Accordingly, the furnace tube is commonly used in a fixed. non-rotatable condition. In the non-rotatable furnace tube, an ampoule tube or a boat is rotated within the furnace tube when required in the liquid-phase epitaxy.

When performing the heat treatment of semiconductor substrates, the semiconductor substrates held on a holder or boat are heated at high temperatures in the range of 100°–1100° C. within a fixed, non-rotatable quartz furnace tube. Partly due to the thermal deformation of a wall of the quartz furnace tube, and partly due to the weight of the semiconductor substrates and boat, the furnace tube is curved or bent downward in the middle of the total length while it is used repeatedly. When the deformation of the furnace tube becomes excessive, the boat cannot be removed from the furnace tube. In order to prevent the foregoing problem, the furnace tube is manually turned about the axis through an angle of 180 degrees to change the top and bottom of the furnace tube at predetermined intervals of use. Even with this manual inversion, the furnace tube is eventually deformed as a result of use for about six months and, therefore, must be repaired.

Furthermore, the fixed, non-rotatable furnace tube has a drawback that radial temperature uniformity is difficult to achieve. In view of this drawback, a heater composed of separated upper and lower heater elements is used to adequately control the temperature distribution in the furnace tube. As an alternative attempt, a controller is used to control the flow of a gas introduced into the furnace tube. In spite of these attempts, radial temperature uniformity has not been achieved.

In the liquid-phase epitaxy, a semiconductor substrate holder or cassette is held within the furnace tube by means of a quartz cantilever (metals cannot be used due to contamination) and the cassette or an ampoule containing the cassette is rotated. In this instance, if the cassette or the ampoule is held in contact with the inside surface of the furnace tube during rotation, no load is exerted on the quartz cantilever, and hence, the quartz cantilever is free from deformation. With this holding arrangement, however, a high speed rotation of the cassette or ampoule is not possible. On the other hand, if the cassette or the ampoule is spaced from the inside surface of the furnace tube during rotation, a high speed rotation is possible. However, a heavy load is exerted on the quartz cantilever, tending to deform and sometime damage or otherwise break the quartz cantilever.

SUMMARY OF THE INVENTION

With the foregoing difficulties of the prior art in view, it is an object of the present invention to provide a semiconductor substrate processing apparatus including a furnace tube which is able to establish high radial temperature uniformity, is free from deformation or bending, and is able to promote movement of solutions in the liquid-phase epitaxy.

According to the invention, there is provided an apparatus for processing a semiconductor substrate, which comprises a furnace tube, means for supply a fluid into the furnace tube, means for discharging said fluid from the furnace tube, means for rotatably supporting the furnace tube, drive means for rotating the furnace tube about its longitudinal axis, and means for controlling operation of the drive means.

The furnace tube and the supply means are connected together by a first rotatable connector, and the furnace tube and the discharge means are connected together by a second rotatable connector. With these rotatable connectors, the furnace tube is continuously rotatable relative to the supply and discharge means. When only a limited angular movement of the furnace tube is needed, two spiral tubes may be used for interconnecting the furnace tube and the supply means and the furnace tube and discharge means.

The apparatus may further include a holder slidably and non-rotatably received in the furnace tube for holding a plurality of semiconductor substrates. The furnace tube includes a guide rail extending longitudinally along an inside surface of the furnace tube for slidably guiding therealong the holder. An elongate setting means has an end formed into an engagement portion lockingly engageable with an end of the holder and is movable longitudinally to move the holder along the guide rail for setting the holder in a desired position within the furnace tube. With this arrangement, the holder can easily be loaded in the furnace tube, then set in the desired position, and finally removed from the furnace tube.

The support means may comprise at least one pair of confronting rollers disposed in contact with a lower portion of the furnace tube, and the drive means may include an electric motor and a power transmission mechanism for transmitting a rotating power of the motor to the furnace tube. The power transmission mechanism may comprise a toothed drive pulley mounted on a drive shaft of the motor, a toothed driven pulley composed of a row of gear teeth formed circumferentially along an outer peripheral surface of the furnace tube, and a timing belt running around the drive pulley and the driven pulley.

The apparatus of this invention is particularly suitable for use in the liquid-phase epitaxial growth process. In this case, the apparatus further includes a holder slidably and non-rotatably received in the furnace tube for holding a plurality of semiconductor substrates in substantially vertical, parallel spaced disposition. The holder has a reaction chamber in which the semiconductor substrates are received, and a solution chamber contiguous to the reaction chamber and holding therein a molten metal or alloy. The semiconductor substrate is separated from the molten metal or alloy when the furnace tube is disposed in a standby position. The semiconductor substrate are brought into contact with the molten metal or alloy when the furnace tube is disposed in a working position 180° out of phase with the standby position. At either of the standby position and the working position, the furnace tube may be oscillated within a predetermined angular range for stirring the molten metal or alloy.

The above and other objects, features and advantages of the present invention will become more apparent from the following description when making reference to the detailed description and the accompanying drawings in which preferred structural embodiments incorporating the principle of the invention are shown by way of illustrative examples.

DETAILED DESCRIPTION OF THE INVENTION

The invention will be described below in greater detail with reference to a preferred embodiment shown in the accompanying drawings.

Figure 1:
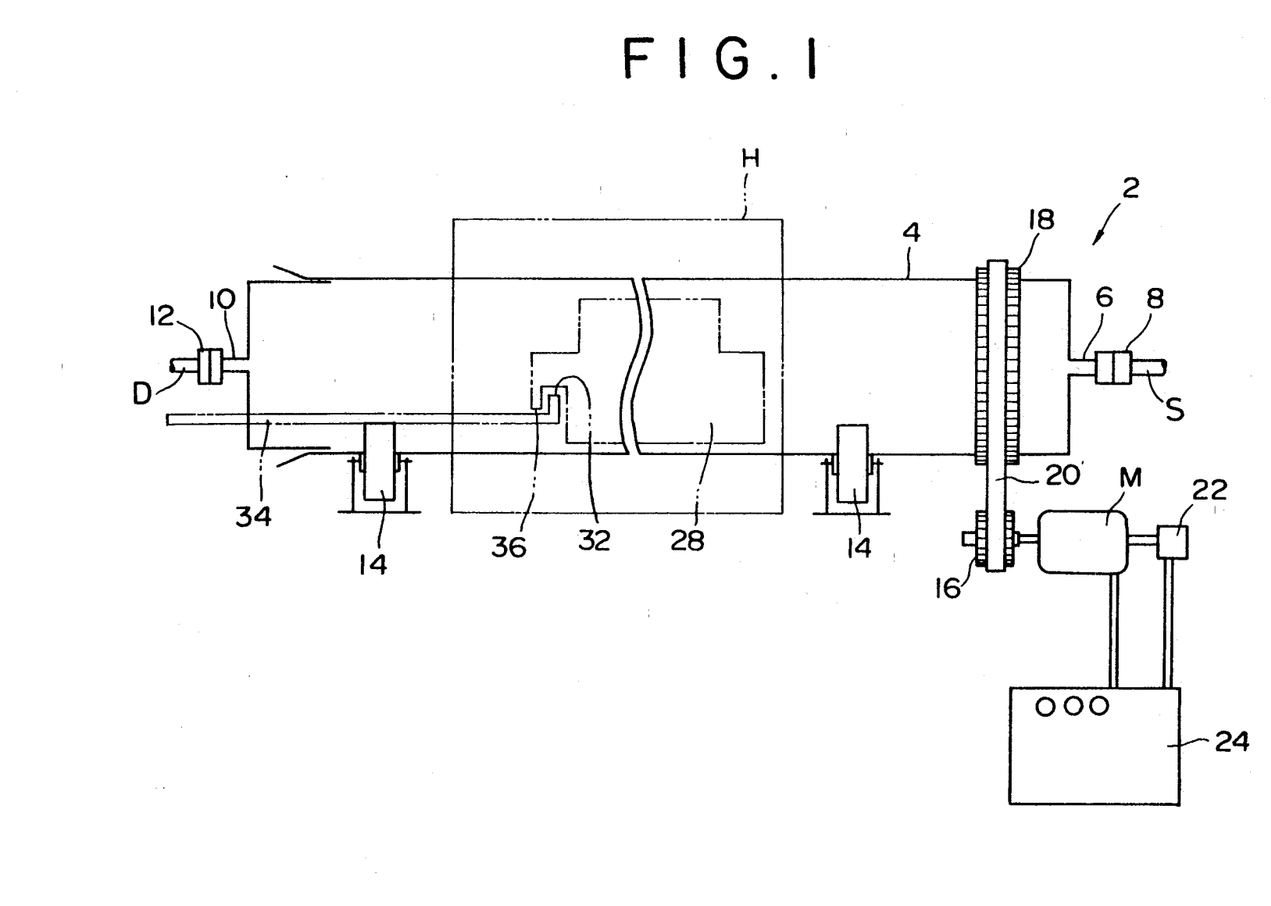
FIG. 1 is a diagrammatical front elevational view of a semiconductor substrate processing apparatus according to the present invention.

FIG. 1 shows, in diagrammatical front elevation, the general construction of a semiconductor substrate processing apparatus 2 according to the present invention. The processing apparatus 2 includes a furnace tube 4 made from a refractory material such as quartz. The furnace tube 4 has at its one end an inlet 6 from which a fluid such as a gas or a solution is supplied into the furnace tube 4 from a fluid supplying means or unit S (only an end part being shown). The fluid supply unit S is connected to the inlet 6 via a rotatable first connector 8. At the opposite end of the furnace tube 4, there is provided an outlet 10 from which the fluid in the furnace tube 4 is discharged. The outlet 10 is connected by a rotatable second connector 12 to a fluid discharging means or unit D (only an end portion being shown). The fluid supplying unit S and the fluid discharging unit D are of the construction known per se and, hence, a further description can be omitted. The rotatable first and second connectors 8 and 12 may be replaced by a known spiral tube. In the case where the furnace tube is angularly movable or oscillating within a limited angular range not exceeding 180 degrees, a conventional tube may be used for connectors between the inlet 6 and the fluid supplying unit S and between the outlet 10 and the fluid discharging unit D.

Two pairs of confronting support rollers 14, 14 are held in contact with an outer peripheral surface of a lower portion of the furnace tube 4 to support thereon the furnace tube 4 in a horizontal posture. The furnace tube 4 thus supported is rotatable about its own longitudinal axis. The support rollers 14 are made from a soft material such as fluoroplastics so as not to damage the quartz furnace tube 4.

The furnace tube 4 is rotated by a drive means or device including an electric motor M. The rotating power of the motor M is transmitted to the furnace tube 4 via a power transmission mechanism. The power transmission mechanism is composed of a toothed drive pulley 16 mounted on a drive shaft of the motor, a toothed driven pulley 18 comprising a row of gear teeth formed circumferentially along an outer peripheral surface of the furnace tube 4, and a timing belt 20 running around the drive and driven pulleys 16 and 18. The power transmission mechanism may be a gear drive or a V-belt drive.

A potentiometer 22 is mounted on the drive shaft of the motor M for monitoring the angular position of the drive shaft. The potentiometer 22 is connected in circuit with a controller 24 which is provided to control the operation of the motor M for controlling various rotating conditions of the furnace tube 4, such as speed of rotation, angle of rotation, angle of inversion, and angle of oscillation.

Figure 2:
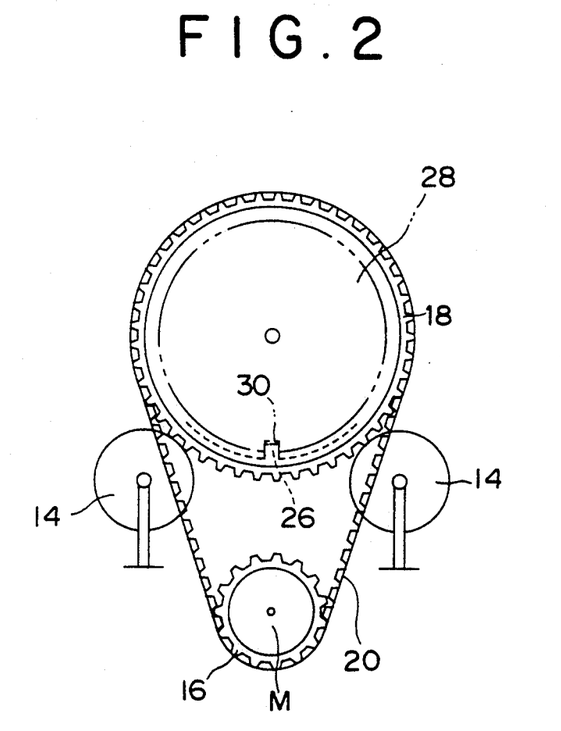
FIG. 2 is an enlarged right side view of FIG. 1, with parts omitted for clarity.

As shown in FIG. 2, the furnace tube 4 includes a guide rail 26 extending longitudinally along the inside surface of the furnace tube 4 for guiding therealong a semiconductor substrate holder 28. The holder 28 is constructed to hold thereon a number of semiconductor substrates (not shown) and has in its bottom surface a groove 30 slidably fitted over the guide rail 26. Thus, the holder 28 is slidably movable along the guide rail 26. The holder 28 has a hook-shaped engagement portion 36 at one end facing to the outlet 10 of the furnace tube 4. The hook-shaped engagement portion 36 is engaged by an L-shaped engagement portion 32 formed at the forward end of an elongate setting means or bar 34. The setting bar 34 extends from the outside to the inside of furnace tube 4 through an opening (not shown) formed in a discharge end of the furnace tube 4. The setting bar 34 is movable back and forth to move the holder 28 along the guide rail 38 and set the holder 28 in a desired position. Reference character H is a heater unit for heating the furnace tube 4.

The processing apparatus 2 of the foregoing construction can be used in performing various semiconductor substrate processing techniques, two examples of which will be described below with reference to FIGS. 3 through 6 and FIGS. 7 through 10, respectively.

Figure 3:
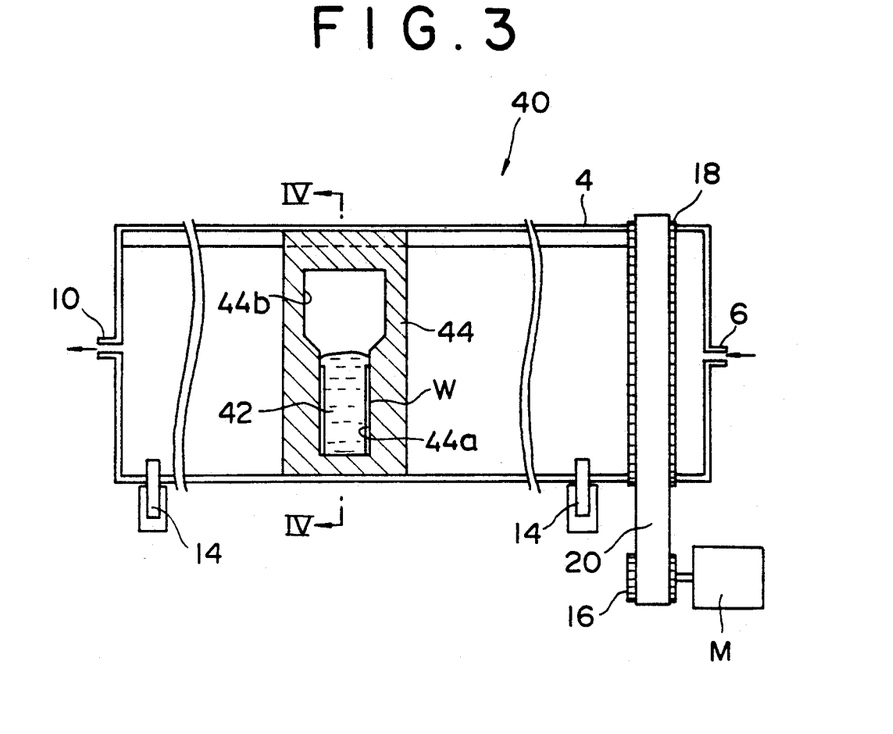
FIG. 3 is a diagrammatical front elevational view, with parts in cross section, of the apparatus as it is applied to the liquid-phase epitaxy.
Figure 4:
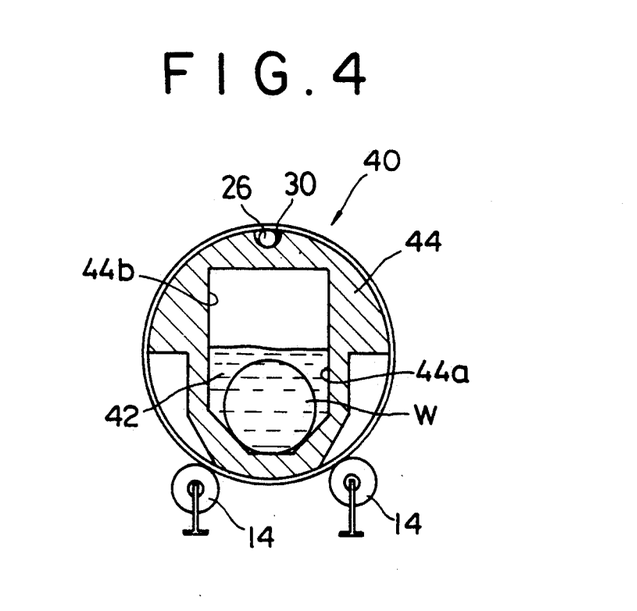
FIG. 4 is a schematic cross-sectional view taken along line IV—IV of FIG. 3.
Figure 5:
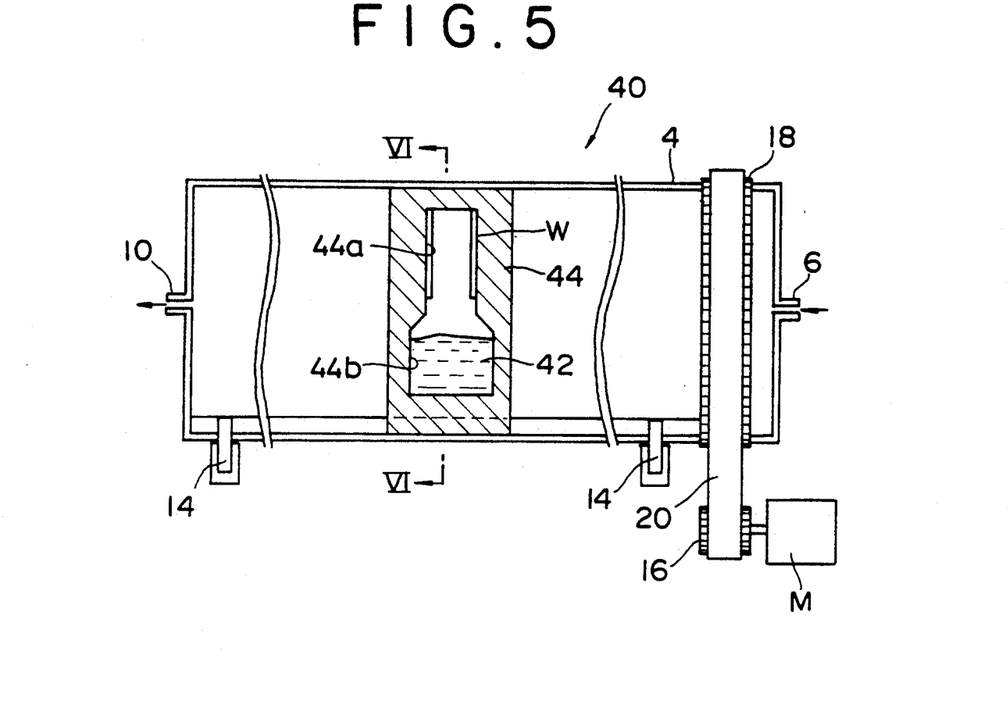
FIG. 5 is a view similar to FIG. 4, but showing the apparatus in a condition 180° out of phase with the condition shown in FIG. 4.
Figure 6:
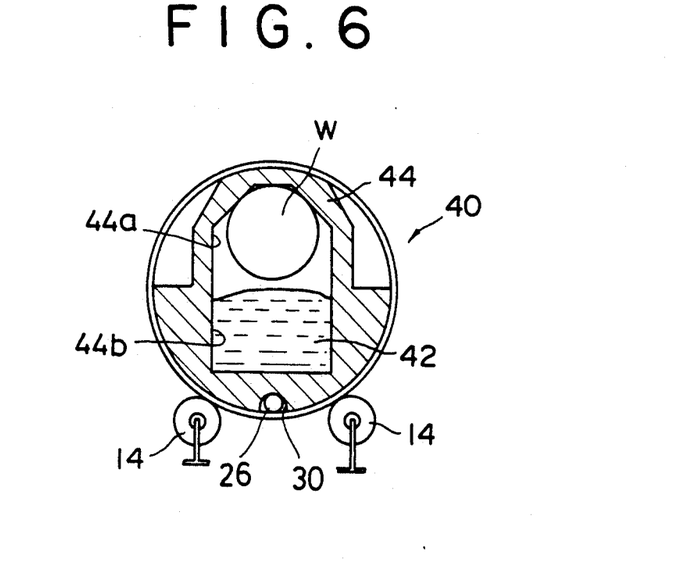
FIG. 6 is a schematic cross-sectional view taken along line VI—VI of FIG. 5.

According to one example shown in FIGS. 3 through 6, the processing apparatus 2 is used as a liquid-phase epitaxial growth system or apparatus 40. The apparatus shown in FIGS. 3 and 4 is disposed in a working position in which the liquid-phase epitaxy proceeds. The apparatus shown in FIG. 5 and 6 is disposed in a standby position before and after the liquid-phase epitaxy is effected.

The liquid-phase epitaxial growth apparatus 40 includes a holder or boat 44 slidably and non-rotatably received in the furnace tube 4 for holding therein a plurality of semiconductor crystal substrates W in substantially vertical, parallel spaced disposition. The boat 44 has a reaction chamber 44a in which the semiconductor crystal substrates W are received, and a solution chamber 44b contiguous to the reaction chamber 44a and holding therein a gallium (Ga) solution 42 (in the form of a molten metal or alloy). The boat 44 is set in a desired position within the furnace tube 4 and is kept non-rotatable relative to the furnace tube 4 by means of engagement between the guide rail 26 and the mating groove 30, as shown in FIG. 6.

As shown in FIGS. 5 and 6, before the epitaxial growth process begins, that is, when the furnace tube 4 is disposed in the standby position, the semiconductor crystal substrates W and the gallium (Ga) solution 42 are separated from one another within the boat 44. That is, the semiconductor crystal substrates W are disposed above a surface of the Ga solution 42. Then, the furnace tube 4 is turned about its longitudinal axis through an angle of 180 degrees so that the furnace tube 4 is moved from the standby position to the working position shown in FIGS. 3 and 4. Thus, the semiconductor crystal substrates W are brought into contact with the Ga solution 42 and the epitaxial growth begins. When the growth of epitaxial layers on the respective semiconductor crystal substrates W is to be terminated or interrupted, the furnace tube 4 is turned again through an angle of 180 degrees and thereby returns to the standby position shown in FIGS. 5 and 6.

The furnace tube 4 may be oscillated within a full limited angular range such as 10 degrees either way. If such an oscillating motion is added when the furnace tube 4 is in the standby position shown in FIGS. 5 and 6, it is possible to accelerate dissolving of a poly source. On the other hand, if the oscillating motion is added when the furnace tube 4 is in the working position shown in FIGS. 3 and 4, solutes in the solution are stirred and mixed homogeneously. As a result, the epitaxial growth proceeds with high solute concentration homogeneity and, hence, the epitaxial layers grown on the semiconductor crystal substrates W are highly uniform in composition and thickness.

The foregoing cycle of operations may be repeated at different temperatures in order to form a plurality of epitaxial layers superposed one above another. During the epitaxial growth process, the gas such as hydrogen is continuously supplied into the furnace tube 4 to renew the atmosphere in the furnace tube 4.

Figure 7:
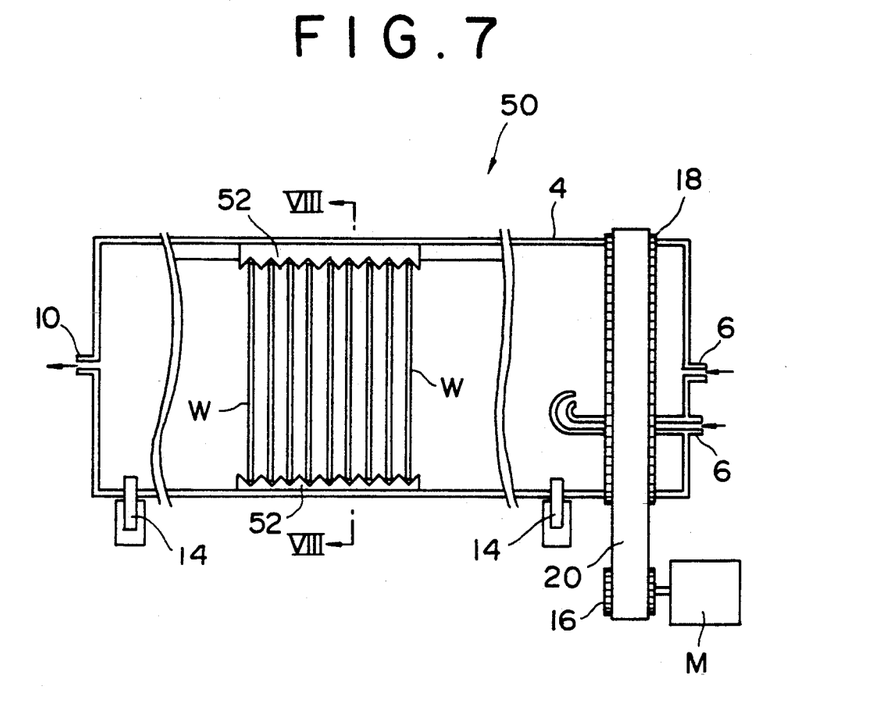
FIG. 7 is a diagrammatical front elevational view, with parts in cross section, of the apparatus as it is applied to the CVD.
Figure 8:
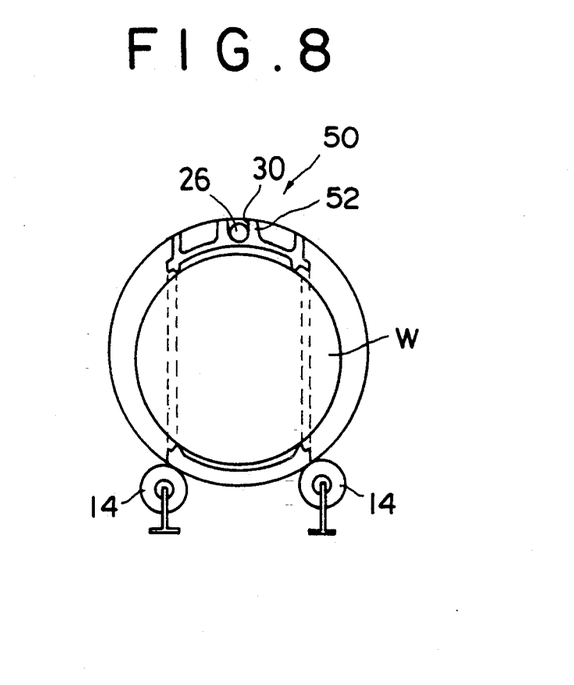
FIG. 8 is a schematic cross-sectional view taken along line VIII—VIII of FIG. 7.

FIGS. 7 through 10 shows another application in which the processing apparatus 2 is used as a semiconductor CVD apparatus or system 50. As shown in FIGS. 7 and 8, a plurality of silicon substrates W are held by a quartz holder 52. The holder 52 is set in a desired position within the furnace tube 4 and, due to the interlocking engagement between the guide rail 26 and the mating groove 30, the holder 52 is non-rotatable relative to the furnace tube 4. The CVD apparatus 50 has two inlets 6, 6, one provided for high-temperature oxygen gas the other for high-temperature hydrogen. These high temperature gases are concurrently introduced into the furnace tube 4 to form an oxide film on each of the silicon substrates W by the pyrogenic method.

Figure 9:
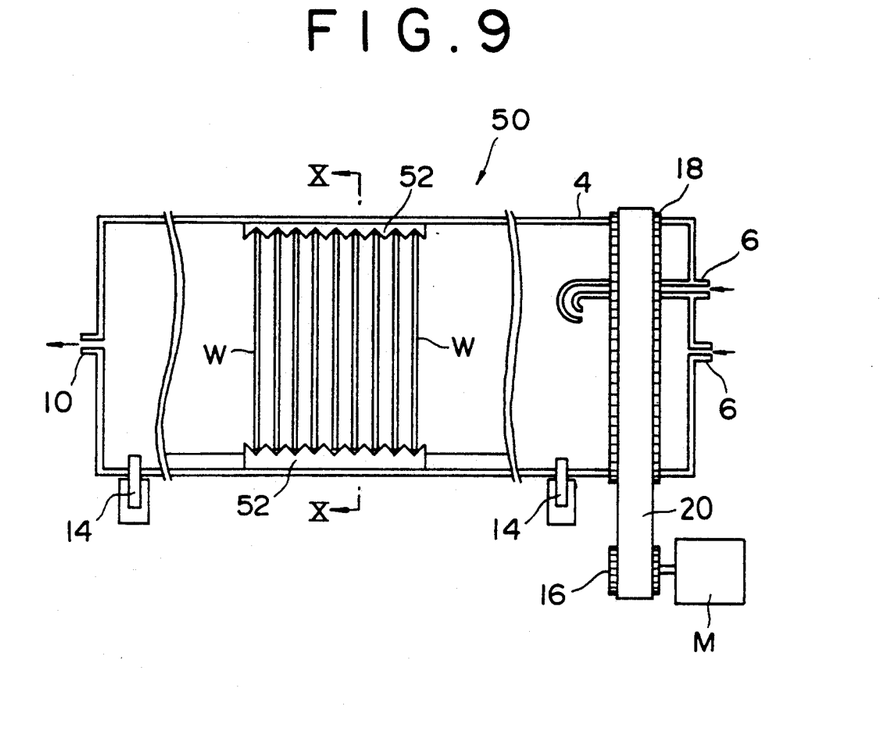
FIG. 9 is a view similar to FIG. 7, but showing the apparatus in a condition 180° out of phase with the condition shown in FIG. 7.
Figure 10:
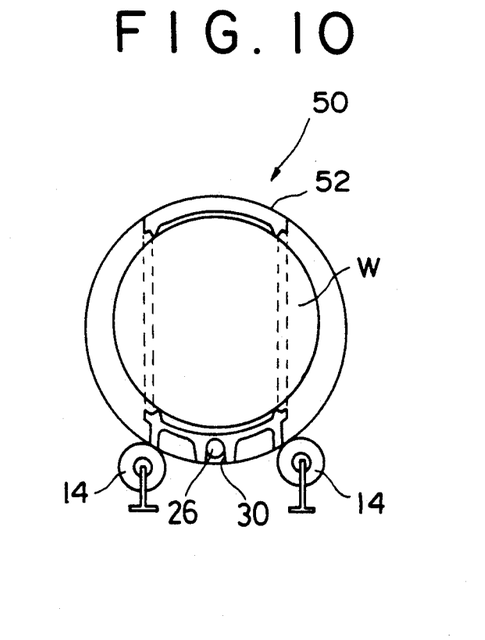
FIG. 10 is a schematic cross-sectional view taken along line X—X of FIG. 9.

FIGS. 9 and 10 show the CVD apparatus 50 which is in a condition 180° out of phase with the condition shown in FIGS. 7 and 8. During the CVD process, the furnace tube 4 is continuously rotated, so that the condition of FIGS. 7 and 8 and the condition of FIGS. 9 and 10 are established alternately and repeatedly. With this continuous rotation of the furnace tube 4, the radial temperature distribution in the furnace tube 4 becomes uniform and the effect of gas flow can be controlled. As a result, oxide films of uniform quality can be produced.

Using the CVD apparatus 50 shown in FIGS. 7 through 10, two groups of p-type silicon substrates, 100 mm in diameter and 20Ωcm in resistivity were thermally oxidized at 1000° C. for 20 min with oxygen flow rate of 3 l/min and hydrogen flow rate of 5 l/min. During the entire CVD processing easing of the first group of silicon substrates, the furnace tube 4 was rotated at 5 r.p.m., while the CVD processing of the second group of silicon substrates was performed without rotating the furnace tube 4. The thickness of oxide films deposited on the silicon substrates was measured by an ellipsometer at the location of 10 points for each silicon substrate. The oxide film thickness of the first group of silicon substrates (obtained by the CVD process involving rotation of the furnace tube 4) was 1478 Å in average with a standard deviation of 40 Å. On the other hand, the oxide film thickness of the second group of silicon substrates (obtained by the CVD process devoid of rotation of the furnace tube 4) was 1526 Å in average with a standard deviation of 423 Å. It appears clear from the foregoing experiment that the thickness uniformity of the oxide films can be largely improved by rotating the furnace tube 4 during the CVD process.

Obviously, various minor changes and modifications of the present invention are possible in the light of the above teaching. It is therefore to be understood that within the scope of the appended claims the invention may be practiced otherwise than as specifically described.

What is claimed is:

1. An apparatus for processing a semiconductor substrate, comprising:
   a furnace tube;
   supply means for supplying a fluid into said furnace tube;
   discharge means for discharging said fluid from said furnace tube;
   support means for rotatably supporting said furnace tube;
   drive means for rotating said furnace tube about its longitudinal axis;
   controlling means for controlling operation of said drive means; and
   a holder slidably and non-rotatably received in said furnace tube for holding a plurality of semiconductor substrates, said furnace tube including a guide rail extending longitudinally along an inside surface of said furnace tube for slidably guiding therealong said holder, and elongate setting means having an end formed with an engagement portion lockingly engageable with an end of said holder, said elongate setting means being movable longitudinally to move said holder along said guide rail for setting the holder in a desired position.

2. An apparatus according to claim 1, wherein said furnace tube and said supply means are connected together by a first rotatable connector, and said furnace tube and said discharge means are connected together by a second rotatable connector.

3. An apparatus according to claim 1, wherein said furnace tube and said supply means are connected together by a first spiral tube, and said furnace tube and said discharge means are connected together by a second spiral tube.

4. An apparatus according to claim 1, wherein said support means includes at least one pair of confronting rollers disposed in contact with a lower portion of said furnace tube, and said drive means includes an electric motor and a power transmission mechanism for transmitting a rotating power of said motor to said furnace tube.

5. An apparatus according to claim 4, wherein said power transmission mechanism includes a toothed drive pulley mounted on a drive shaft of said motor, a toothed driven pulley composed of a row of gear teeth formed circumferentially along an outer peripheral surface of said furnace tube, and a timing belt running around said drive pulley and said driven pulley.

6. An apparatus according to claim 1 or 4, for use as a liquid-phase epitaxial growth system, wherein said holder holds said plurality of semiconductor substrates in substantially vertical, parallel spaced disposition, said holder having a reaction chamber in which the semiconductor substrates are received, and a solution chamber contiguous to said reaction chamber and holding therein a molten metal or alloy, the semiconductor substrates being separated from said molten metal or alloy when said furnace tube is disposed in a standby position, said semiconductor substrates being brought into contact with said molten metal or alloy when said furnace tube is disposed in a working position 180° out of phase with said standby position.

7. An apparatus according to claim 6, wherein said drive means is operated by said controlling means to oscillate said furnace tube within an angular range when said furnace tube is disposed in said standby position.

8. An apparatus according to claim 6, wherein said drive means is operated by said controlling means to oscillate said furnace tube within an angular range when said furnace tube is disposed in said working position.

* * * * *